(12) United States Patent
Yamazaki

(10) Patent No.: US 7,329,589 B2
(45) Date of Patent: Feb. 12, 2008

(54) METHOD FOR MANUFACTURING SILICON-ON-INSULATOR WAFER

(75) Inventor: Toru Yamazaki, Saga (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 309 days.

(21) Appl. No.: 11/091,589

(22) Filed: Mar. 29, 2005

(65) Prior Publication Data
US 2005/0227454 A1    Oct. 13, 2005

(30) Foreign Application Priority Data
Mar. 29, 2004   (JP)   ............................ 2004-095491

(51) Int. Cl.
*H01L 21/46*   (2006.01)
(52) U.S. Cl. ............................ 438/458; 257/E21.563
(58) Field of Classification Search ................ 438/458; 257/E21.563
See application file for complete search history.

(56) References Cited

U.S. PATENT DOCUMENTS

| | | | |
|---|---|---|---|
| 5,310,689 A * | 5/1994 | Tomozane et al. ......... | 438/766 |
| 6,326,285 B1 * | 12/2001 | Behfar et al. ............... | 438/455 |
| 6,661,065 B2 * | 12/2003 | Kunikiyo ..................... | 257/411 |
| 2004/0222438 A1 * | 11/2004 | Otani et al. ................. | 257/200 |

* cited by examiner

*Primary Examiner*—Bradley K Smith
(74) *Attorney, Agent, or Firm*—Antonelli, Terry, Stout & Kraus, LLP.

(57) ABSTRACT

A method for manufacturing a SOI wafer includes a step of forming a SOI wafer including a silicon support, an insulating layer containing oxide, and a superficial silicon layer arranged in that order and also includes a step of introducing hydrogen into the interface between the insulating layer and the superficial silicon layer. The SOI wafer is heat-treated in an atmosphere containing hydrogen or water in the hydrogen-introducing step. A method for manufacturing a SOI wafer includes a step of forming a SOI wafer including a silicon support, an insulating layer containing oxide, and a superficial silicon layer arranged in that order; a step of introducing hydrogen into the interface between the insulating layer and the superficial silicon layer by forming a film on an oxide layer present on the SOI wafer using a reaction to generate hydrogen; and a step of removing the film.

12 Claims, 12 Drawing Sheets

METHOD FOR MANUFACTURING SILICON-ON-INSULATOR WAFER

BACKGROUND OF THE INVENTION

1. Field of the Invention

The present invention relates to a method for manufacturing a wafer including a superficial silicon layer, an insulating layer containing oxide, and a silicon support arranged in that order. This type of wafer is referred to as a silicon-on-insulator wafer (hereinafter referred to as an SOI wafer).

2. Description of the Related Art

In recent years, the following wafers have been attracting much attention: wafers having a silicon-on-insulator (SOI) structure in which an oxide insulating layer is placed between a silicon support and a superficial silicon layer. These wafers are referred to as SOI wafers and are suitable for manufacturing substrates for high-performance transistors. Electronic devices including such SOI wafers have the following advantages: an increase in processing speed due to a reduction in junction capacitance, a reduction in electrical consumption, a reduction in operating voltage due to a decrease in substrate bias, an increase in resistance to soft error because of the complete separation of elements, the prevention of latch up, and the prevention of interference and noise due to substrates. That is, such electronic devices have high performance and reliability.

In order to further enhance the performance and reliability of the electronic devices, it is necessary to allow the interface between the superficial silicon layer and the insulating layer to have low interface state density.

The interface therebetween is usually reduced in interface state density in the same manner as gate insulating layers are formed and then heat-treated in a hydrogen atmosphere such that the interface state density of the gate insulating layers is reduced. This procedure is used to fabricate electronic devices such as MOSFETs on SOI wafers or used to fabricate such electronic devices on ordinary wafers such as CZ wafers or epitaxial wafers.

If an SOI wafer used to fabricate such electronic devices is treated in a hydrogen atmosphere, oxide contained in the insulating layer is reduced into oxygen, which permeates the superficial silicon layer. Oxygen precipitates are formed in the superficial silicon layer during heat treatment performed in a subsequent step, whereby the SOI wafer is deteriorated in quality. This probably leads to a deterioration in the performance and reliability of the electronic devices.

Japanese Unexamined Patent Application Publication No. 2002-26299 (hereinafter referred to as Patent Document 1) discloses a technique for allowing the interface between a superficial silicon layer and an insulating layer to have low interface state density without heat-treating an SOI wafer in a hydrogen atmosphere. In this technique, nitrogen precipitates having a predetermined nitrogen content are formed in the interface therebetween when the SOI wafer is used to fabricate electronic devices, whereby the interface therebetween is reduced in interface state density.

In the technique disclosed in Patent Document 1, since an oxynitride film is formed on the superficial silicon layer, the superficial silicon layer is reduced in thickness depending on the thickness of the oxynitride film. This leads to a deterioration in the quality of the SOI wafer. Therefore, electronic devices manufactured from the SOI wafer have low performance and reliability.

Thus, in order to enhance the performance and reliability of electronic devices manufactured from SOI wafers, it is necessary to manufacture an SOI wafer having low interface state density and high quality.

SUMMARY OF THE INVENTION

Accordingly, it is an object of the present invention to provide a method for manufacturing an SOI wafer having low interface state density and high quality.

The present invention has been made to achieve the above object. A method for manufacturing a SOI wafer according to the present invention includes a step of forming a SOI wafer including a silicon support, an insulating layer containing oxide, and a superficial silicon layer arranged in that order and also includes a step of introducing hydrogen into the interface between the insulating layer and the superficial silicon layer. These steps are performed in that order and the SOI wafer is heat-treated in an atmosphere containing hydrogen or water in the hydrogen-introducing step.

The inventors have found that hydrogen can be introduced into the interface between the superficial silicon layer and the insulating layer by adjusting the temperature and time of heat treatment in such a manner that the SOI wafer is not heat-treated in a hydrogen atmosphere but in such an atmosphere containing hydrogen or water. The introduction of hydrogen into the interface therebetween leads to a decrease in interface state density. If the SOI wafer is heat-treated in a hydrogen atmosphere, the following problem occurs: a problem in that oxide contained in the insulating layer is reduced into oxygen, which penetrates the superficial silicon layer. However, according to this technique, such a problem can be prevented from occurring. Furthermore, the superficial silicon layer can be prevented from being reduced in thickness due to the formation of an oxynitride film and the interface between the superficial silicon layer and the insulating layer can be reduced in interface state density. That is, the interface therebetween can be reduced in interface state density without causing a deterioration in the quality of the SOI wafer.

In the above method, the SOI wafer is preferably heat-treated at 350° C. or more for three minutes or more in an atmosphere containing 0.07 percent by weight or more of hydrogen or 0.4 percent by weight or more of water in the hydrogen-introducing step. The interface therebetween can thereby be reduced in interface state density without causing a deterioration in the quality of the SOI wafer.

The introduction of hydrogen causes oxidation-enhanced diffusion depending on the amount of hydrogen. This allows fine oxygen precipitates, functioning as oxygen precipitate nuclei, to be formed; hence, a large amount of such oxygen precipitates may be formed in the superficial silicon layer by heat treatment performed in a subsequent step in some cases. The formation of the oxygen precipitates in the superficial silicon layer leads to element failures to cause a deterioration in the quality of the SOI wafer. Therefore, the amount of introduced hydrogen must be controlled such that the oxygen precipitates can hardly be formed.

In the method, the SOI wafer is preferably heat-treated at 750° C. or less for 30 minutes or less in an atmosphere containing 0.2 percent by weight or less of hydrogen or 3.7 percent by weight or less of water in the hydrogen-introducing step. This prevents oxide contained in the insulating layer from being reduced into oxygen; hence, no oxygen penetrates the superficial silicon layer. The amount of the oxygen precipitates can be prevented from being increased. Therefore, the SOI wafer can be prevented from being deteriorated in quality.

In the method, the SOI wafer is preferably placed on a hot plate in the hydrogen-introducing step. According to this technique, since a furnace for heat treatment is not necessary, a system for manufacturing the SOI wafer can be simplified.

The method may further include a step of removing an oxide layer present on the superficial silicon layer, the oxide layer-removing step being performed prior to the hydrogen-introducing step. Since such an oxide layer formed on the superficial silicon layer by heat treatment during the preparation of the SOI wafer is removed, hydrogen can be readily introduced into the interface between the superficial silicon layer and the insulating layer. Therefore, the interface therebetween can be reduced in low interface state density without causing a deterioration in the quality of the SOI wafer.

A method for manufacturing a SOI wafer according to the present invention includes a step of forming a SOI wafer including a silicon support, an insulating layer containing oxide, and a superficial silicon layer arranged in that order; a step of introducing hydrogen into the interface between the insulating layer and the superficial silicon layer by forming a film on an oxide layer present on the SOI wafer using a reaction to generate hydrogen; and a step of removing the film. These steps are performed in that order.

According to this method, hydrogen can be readily introduced into the interface between the superficial silicon layer and the insulating layer without causing a deterioration in the quality of the SOI wafer because the SOI wafer is not heat-treated in a hydrogen atmosphere and no oxynitride layer is formed. Therefore, the interface therebetween can be reduced in interface state density without causing a deterioration in the quality of the SOI wafer.

In this method, the film preferably contains nitride and is formed by a plasma-enhanced chemical vapor deposition process using a monosilane gas and an ammonia gas.

According to this technique, hydrogen can be introduced into the interface therebetween during the formation of the nitride film.

In this method, the film containing nitride preferably has a thickness of 300 Å or more. This allows the interface therebetween to have low interface state density.

In this method, the film preferably contains copper and is formed by an electroless plating process using a copper sulfate solution.

According to this technique, hydrogen can be introduced into the interface therebetween during the formation of the copper film.

In this method, the film containing copper preferably has a thickness of 1,000 Å or more. This allows the interface therebetween to have low interface state density.

According to the present invention, the interface between a superficial silicon layer and an insulating layer can be reduced in interface state density without causing a deterioration in the quality of an SOI wafer

DESCRIPTION OF THE PREFERRED EMBODIMENTS

First Embodiment

Figure 1:
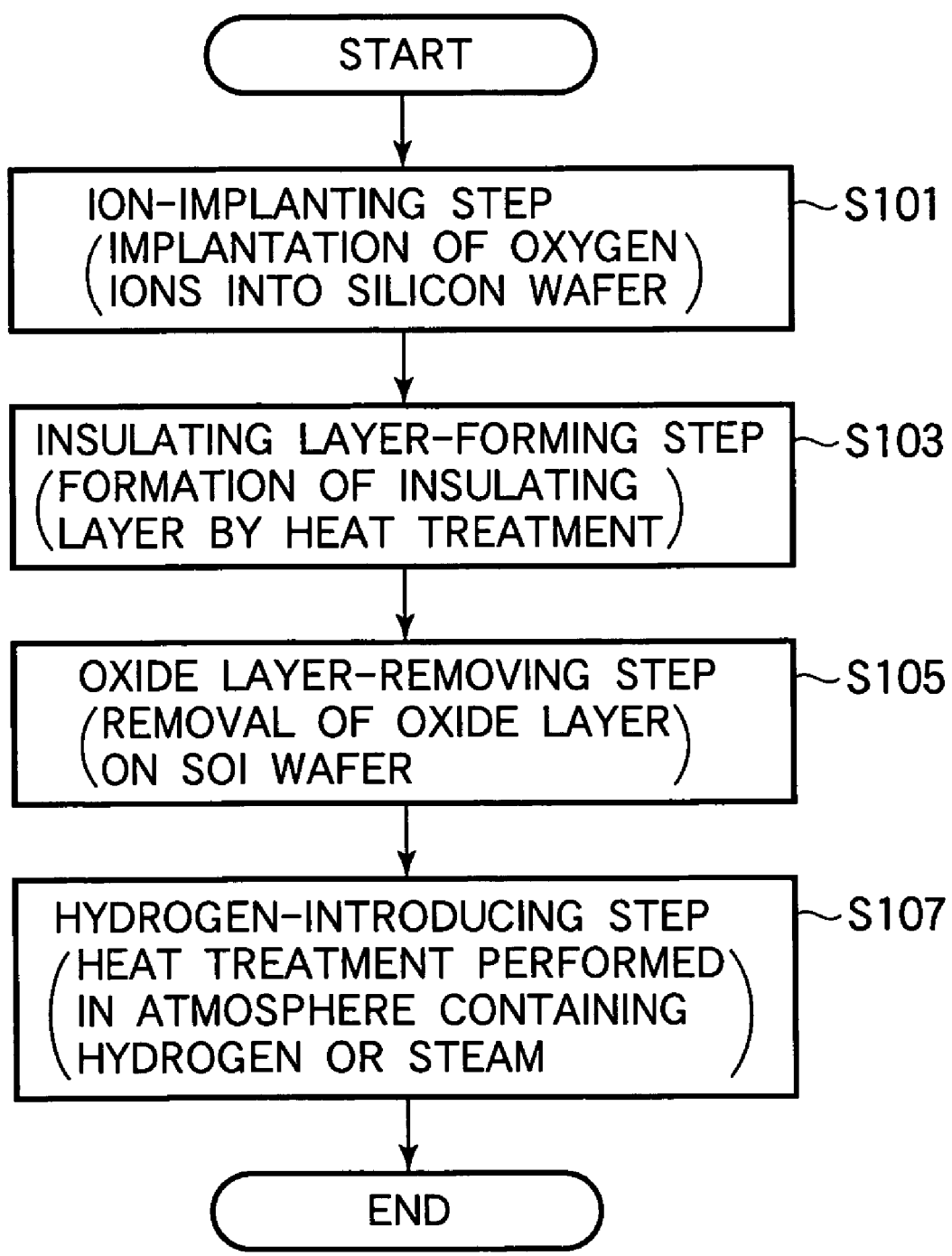
FIG. 1 is a flow chart illustrating a procedure for manufacturing an SOI wafer according to a first embodiment of the present invention using a SIMOX process.
Figure 2:
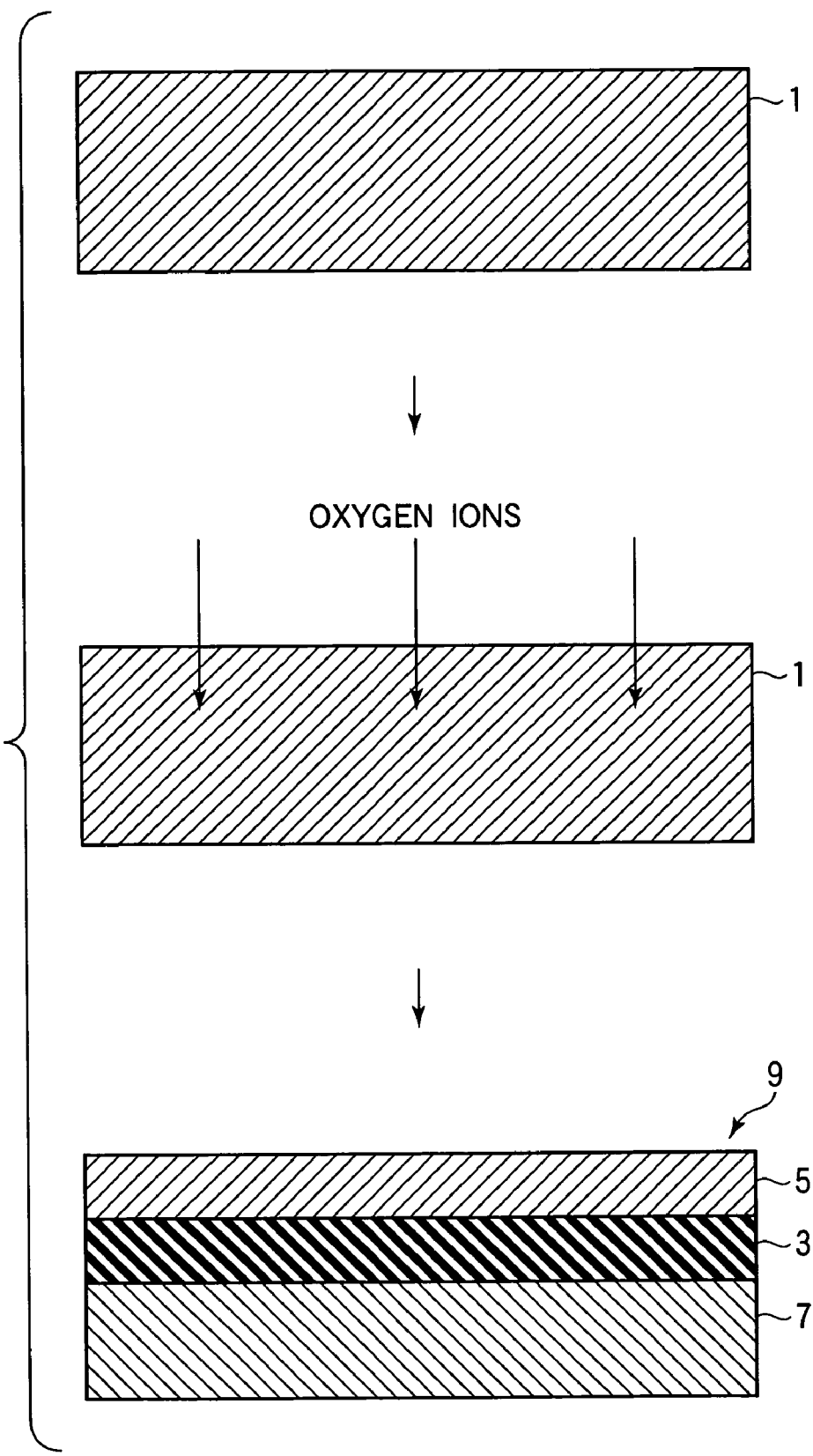
FIG. 2 is a schematic view showing the manufacturing procedure.
Figure 3:
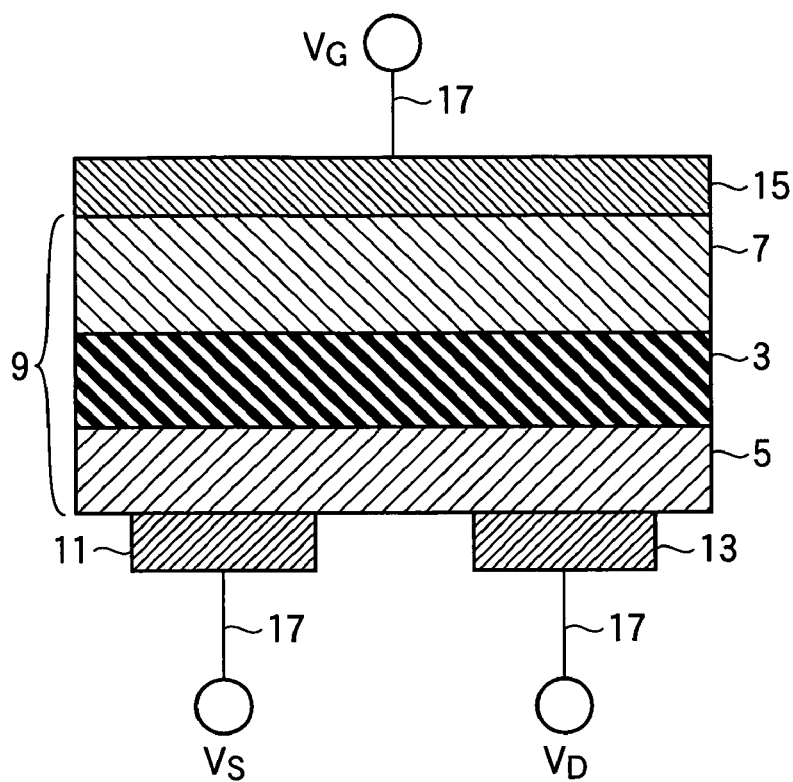
FIG. 3 is an illustration showing a system for measuring the interface state density.
Figure 4:
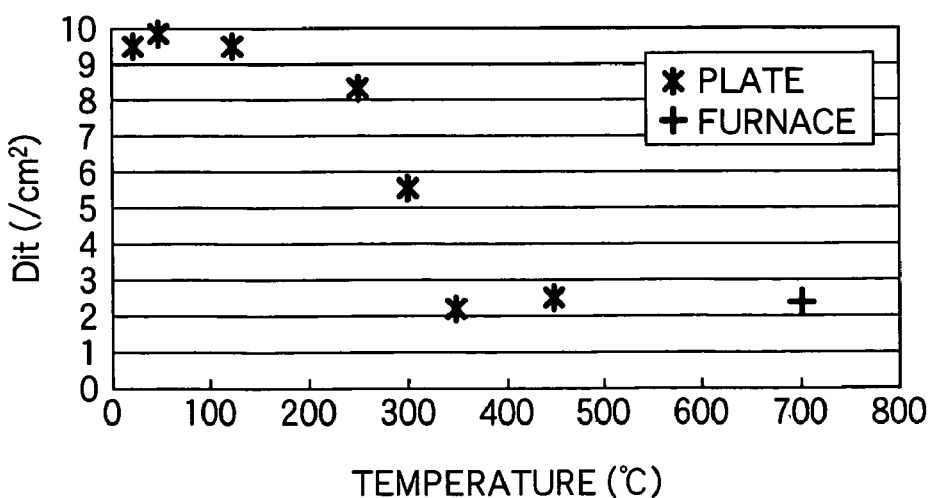
FIG. 4 is a graph showing the relationship between the heat treatment temperature and interface state density of SIMOX SOI wafers heat-treated for 30 minutes.
Figure 5:
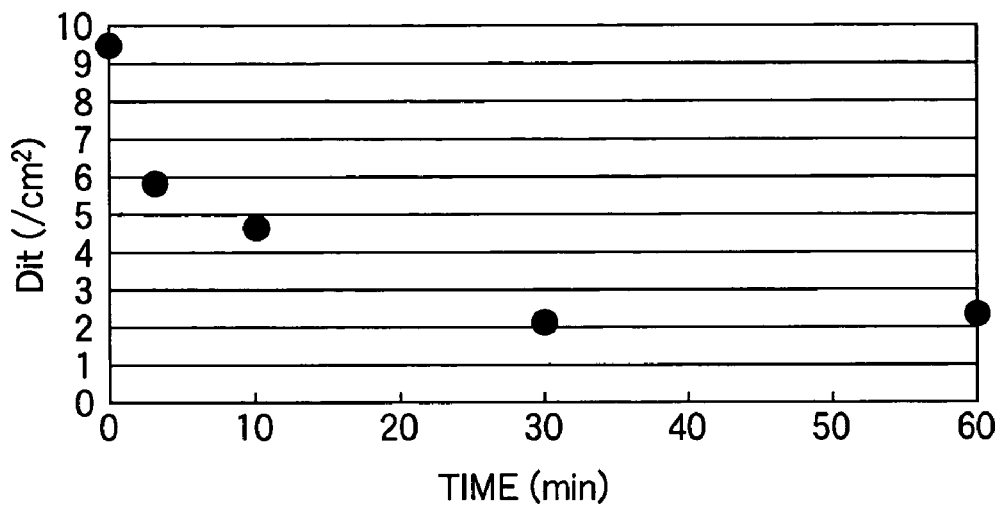
FIG. 5 is a graph showing the relationship between the heat treatment time and the interface state density of SIMOX SOI wafers heat-treated at 350° C.
Figure 6:
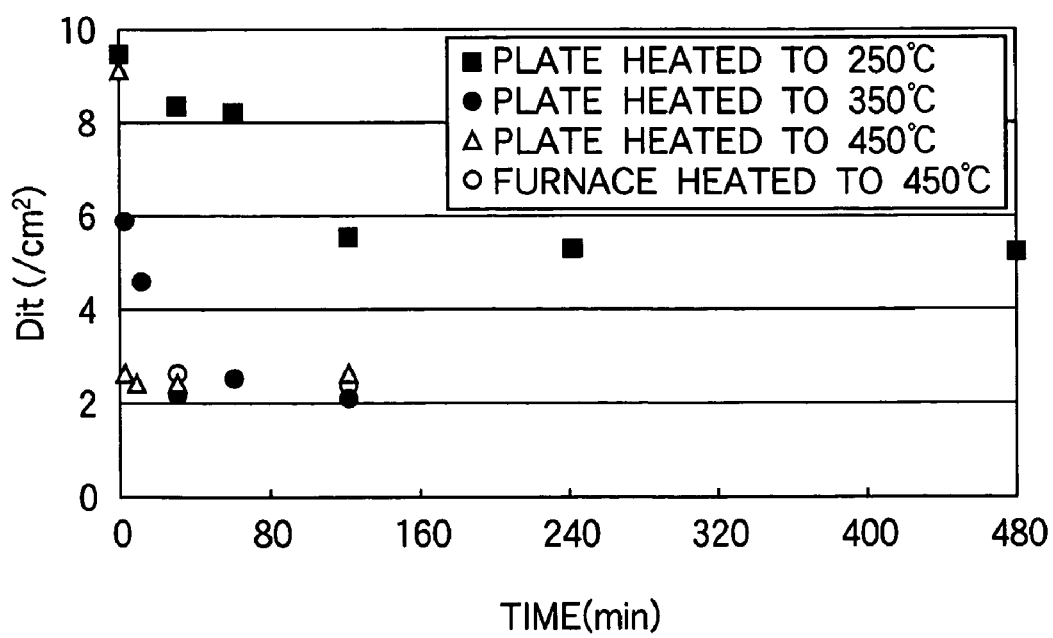
FIG. 6 is a graph showing the relationship between the heating time and the interface state density of SIMOX SOI wafers heat-treated at different temperatures.
Figure 7:
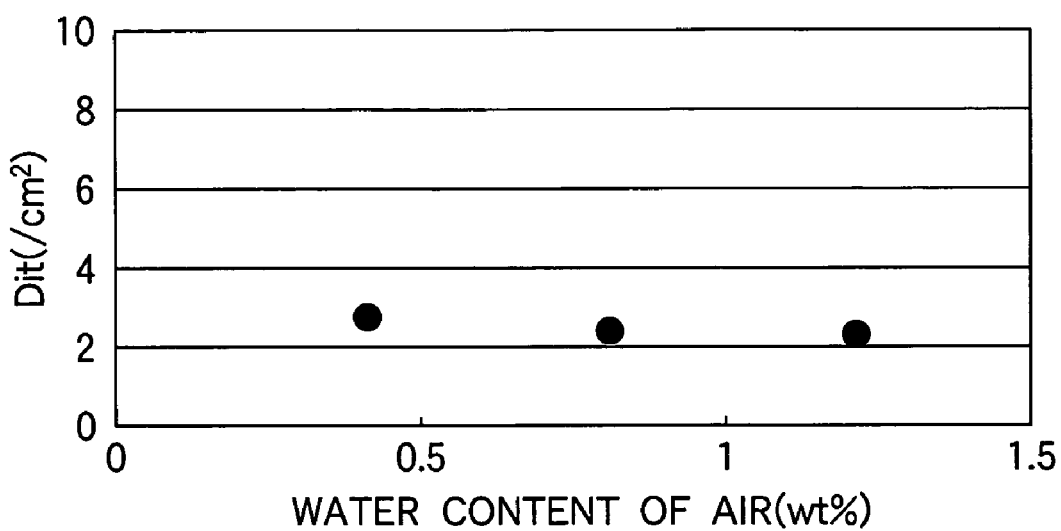
FIG. 7 is a graph showing the relationship between the water content of atmospheres in which SIMOX SOI wafers have been treated at 350° C. for 30 minutes and the interface state density of the SIMOX SOI wafers.
Figure 8:
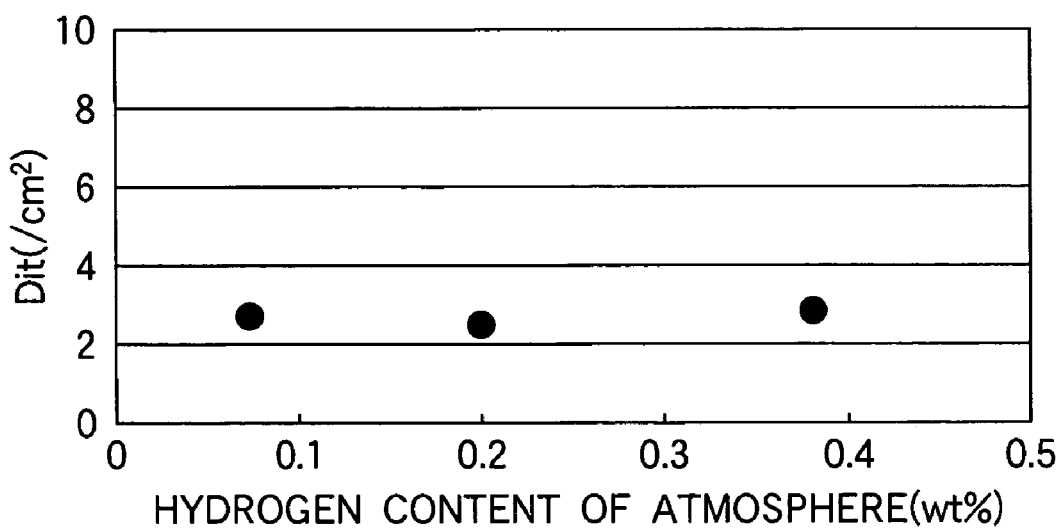
FIG. 8 is a graph showing the relationship between the hydrogen content of atmospheres in which SIMOX SOI wafers have been treated at 350° C. for 30 minutes and the interface state density of the SIMOX SOI wafers.
Figure 9:
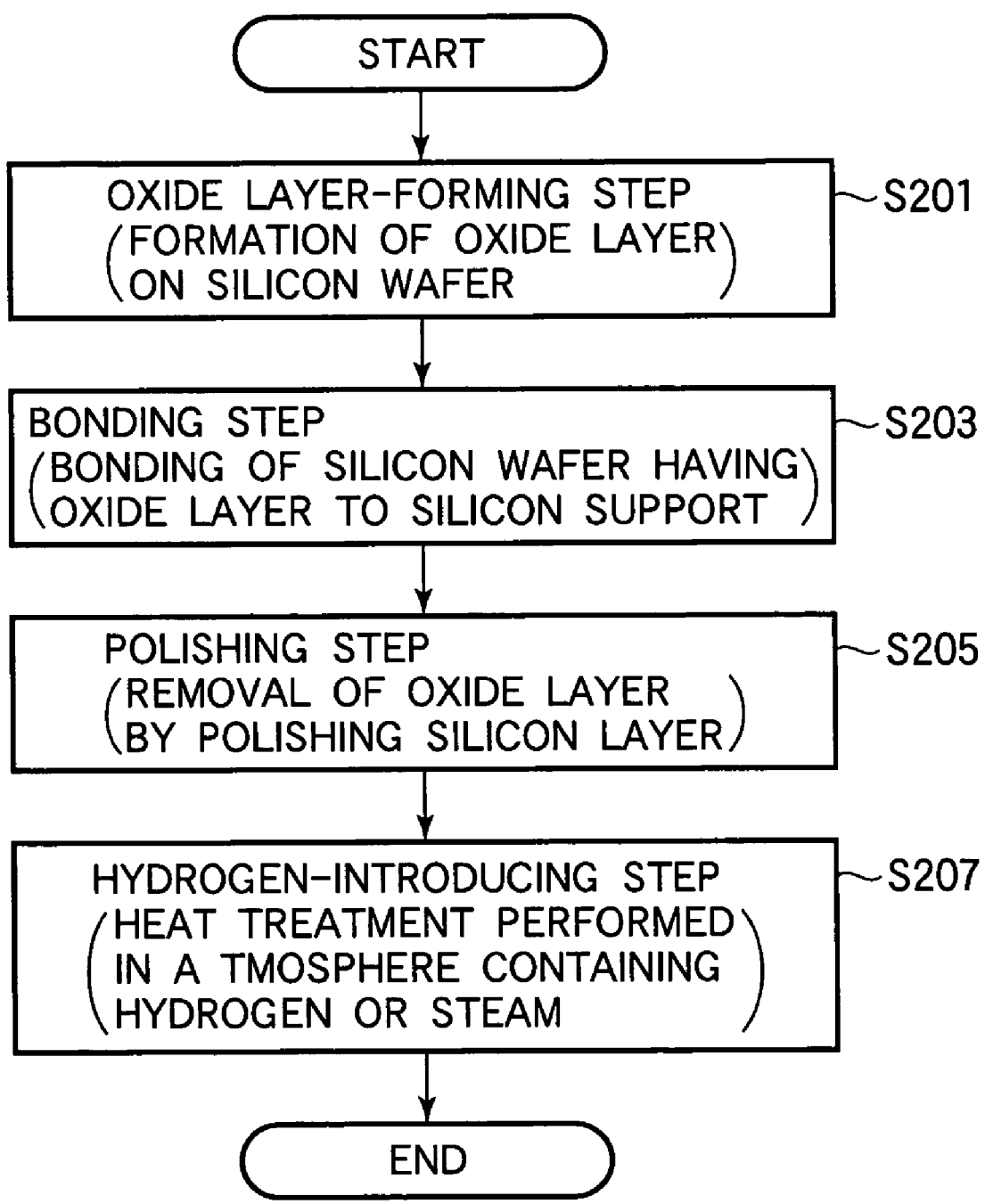
FIG. 9 is a flow chart illustrating a procedure for manufacturing an SOI wafer by a bonding process.
Figure 10:
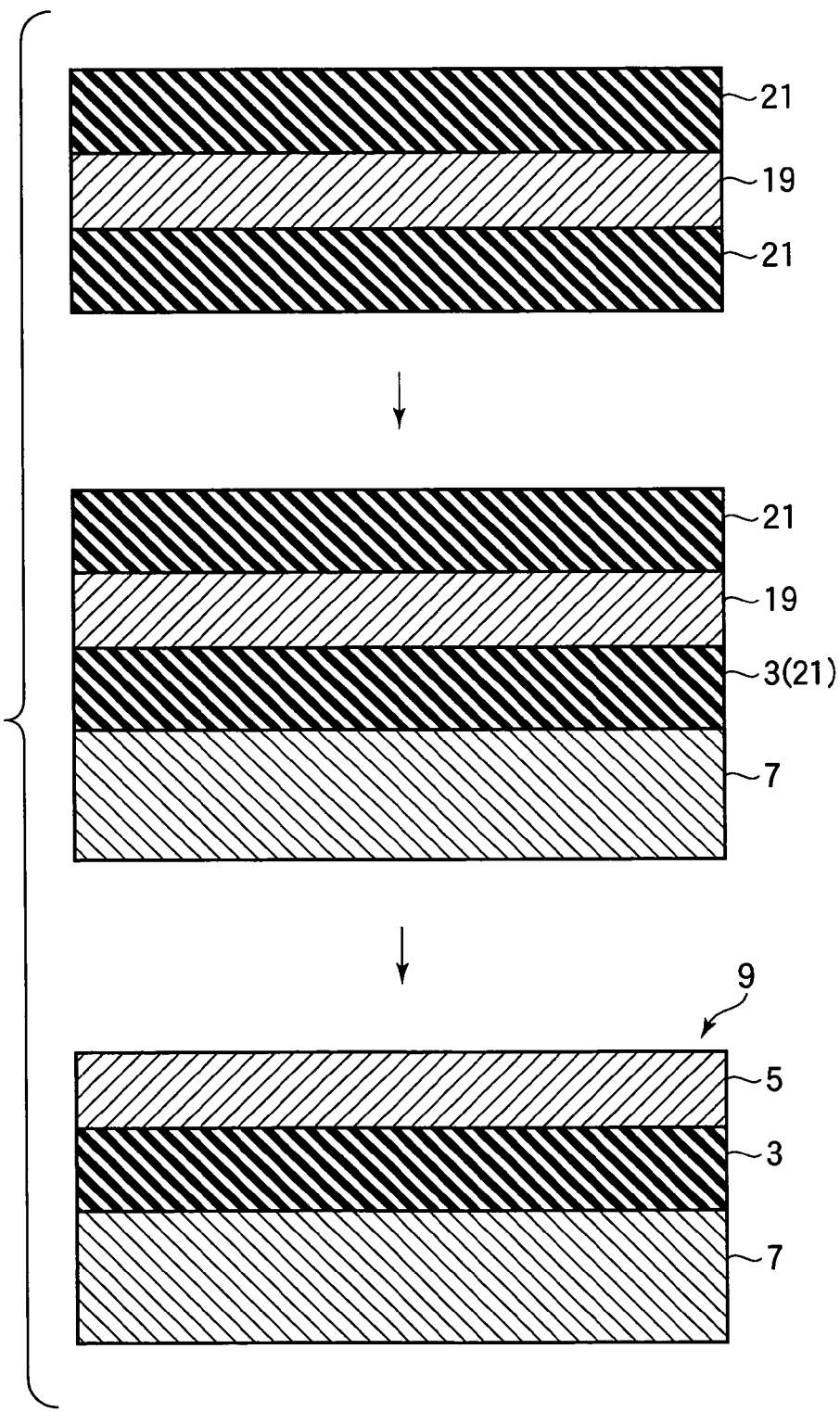
FIG. 10 is a schematic view showing the manufacturing procedure.
Figure 11:
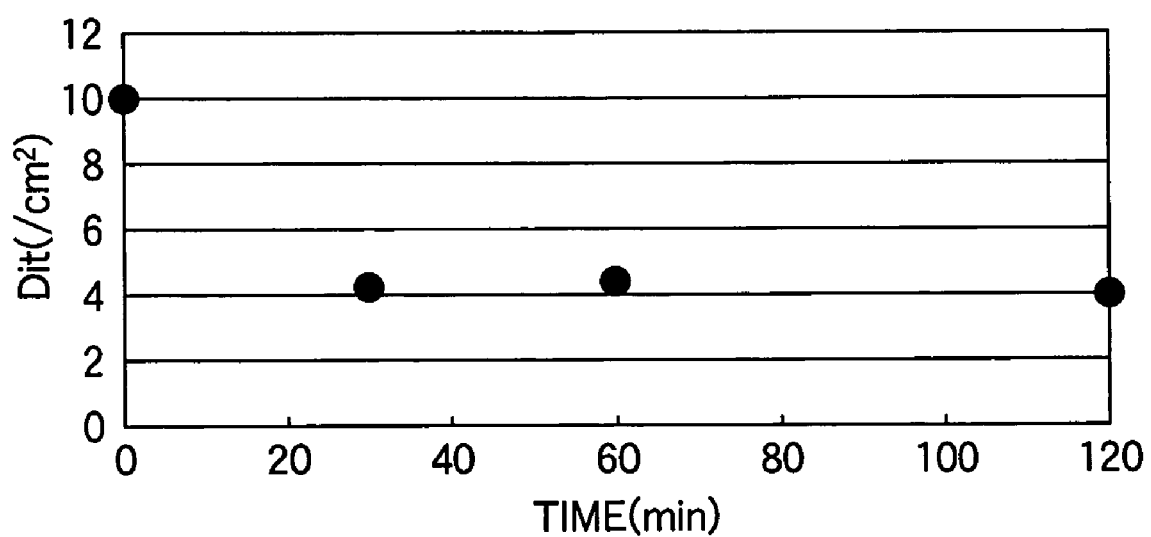
FIG. 11 is a graph showing the relationship between the heat treatment time and interface state density of SOI wafers, manufactured by such a bonding process, heat-treated at 350° C.

A method for manufacturing an SOI wafer according to a first embodiment of the present invention will now be described with reference to FIGS. 1 to 11. FIG. 1 is a flow chart illustrating a procedure for manufacturing an SOI wafer by a separation-by-implanted oxygen process (hereinafter referred to as a SIMOX process). This type of SOI wafer is hereinafter referred to as a SIMOX SOI wafer. FIG. 2 is a schematic view showing the manufacturing procedure. FIG. 3 is an illustration showing a system for measuring the interface state density. FIG. 4 is a graph showing the relationship between the heat treatment temperature and interface state density of SIMOX SOI wafers heat-treated for 30 minutes. FIG. 5 is a graph showing the relationship between the heat treatment time and the interface state density of SIMOX SOI wafers heat-treated at 350° C. FIG. 6 is a graph showing the relationship between the heating time and the interface state density of SIMOX SOI wafers heat-treated at different temperatures. FIG. 7 is a graph showing the relationship between the water content of atmospheres in which SIMOX SOI wafers have been treated at 350° C. for 30 minutes and the interface state density of the SIMOX SOI wafers. FIG. 8 is a graph showing the relationship between the hydrogen content of atmospheres in which SIMOX SOI wafers have been treated at 350° C. for 30 minutes and the interface state density of the SIMOX SOI wafers. FIG. 9 is a flow chart illustrating a procedure for manufacturing an SOI wafer by a bonding process. FIG. 10 is a schematic view showing the manufacturing procedure. FIG. 11 is a graph showing the relationship between the heat treatment time and interface state density of SOI wafers, manufactured by such a bonding process, heat-treated at 350° C.

An ordinary method for manufacturing an SOI wafer uses one of two processes described below. One is the SIMOX process, described above, in which oxygen ions are implanted into a silicon wafer by heating the silicon wafer to a predetermined temperature and then annealed, whereby an insulating layer referred to as a buried oxide layer (hereinafter referred to as a BOX layer) is formed in the silicon wafer. The other one is the bonding process, described above, in which an oxide layer is formed on a silicon wafer in advance and then bonded to another silicon wafer, of which the thickness is reduced to a predetermined value.

The method of this embodiment that uses the SIMOX process is as described below. With reference to FIGS. 1 and 2, the method includes an ion-implanting step (hereinafter referred to as Step 101) of implanting oxygen ions into a silicon wafer 1; an insulating layer-forming step (hereinafter referred to as Step 103) of forming an insulating layer 3 containing silicon dioxide by heat-treating the silicon wafer 1; an oxide layer-removing step (hereinafter referred to as Step 105) of removing a thermal oxide layer placed on a superficial silicon layer 5, those layers being formed on the insulating layer 3 in that order in the insulating layer-forming step; and a hydrogen-introducing step (hereinafter referred to as Step 107) of annealing, or heat-treating the resulting silicon wafer 1 in an atmosphere containing hydrogen or water, those steps being performed in that order. The insulating layer 3 and the superficial silicon layer 5 may be referred to as a BOX layer and a SOI layer, respectively.

In Step 101, in order to allow oxygen ions to reach a predetermined zone of the silicon wafer 1, ion implantation is performed under the following conditions: an acceleration energy of 170 keV and a dose of $5 \times 10^{17}/cm^2$. In Step 103, the resulting silicon wafer 1 is heat-treated at, for example, 1,300° C. for about six hours or more, whereby the wafer zone containing the oxygen ions is converted into the insulating layer 3. Since the insulating layer 3 is created in the silicon wafer 1, a region of the silicon wafer 1 that is present on the insulating layer 3 is converted into the superficial silicon layer 5 and a region of the silicon wafer 1 that is present under the insulating layer 3 is converted into a silicon support 7, whereby a SOI wafer 9 is obtained.

In Step 103, since the silicon wafer 1 is treated in an oxidative atmosphere, the thermal oxide layer is formed on the superficial silicon layer 5. Therefore, in Step 105, the thermal oxide layer is removed from the SOI wafer 9 using hydrofluoric acid or another acid. In Step 107, the resulting SOI wafer 9 is heat-treated in such a manner that the SOI wafer 9 is placed on a hot plate placed in an atmosphere containing hydrogen or water or placed in a furnace in which the atmosphere contains hydrogen or water, whereby hydrogen is introduced into the SOI wafer 9. According to this procedure, the SOI wafer 9 is finished.

A procedure for investigating the relationship between the interface state density and the following factors will now be described: the hydrogen or water content of atmospheres used in Step 107 and the temperature and time of heat treatment performed in Step 107. SOI wafers having the same configuration as that of the SOI wafer 9 are prepared by processing boron-doped p-type wafers having a diameter of 200 mm in Steps 101 to 107 shown in FIG. 1. In particular, the SOI wafers are heat-treated in Step 107 under different conditions and then cleaned with hydrofluoric acid, whereby native oxides are removed therefrom. The SOI wafers are further cleaned with pure water and then dried by nitrogen blowing.

As shown in FIG. 3, after the SOI wafers are dried, two pieces of mercury are provided on a superficial silicon layer 5 of each SOI wafer, whereby a source electrode 11 and a drain electrode 13 for forming a MOSFET are formed thereon. A gate electrode 15 is formed on a silicon support 7 of the SOI wafer. The source electrode 11, the drain electrode 13, and the gate electrode 15 are connected to power supplies with wires 17. According to this procedure, samples for the investigation are obtained. A voltage is applied between the source electrode 11 and the drain electrode 13 of each sample and a voltage is applied to the gate electrode 15 of the sample, whereby an Ids-Vgs curve is obtained. The interface state density of the sample is calculated from this curve.

FIG. 4 shows the relationship between the heat treatment temperature and the interface state density of the samples heat-treated in an atmosphere containing 0.8 percent by weight of water for 30 minutes using a hot plate or a furnace in Step 107. As is clear from FIG. 4, the samples heat-treated at 350° C. or more have markedly low interface state density.

FIG. 5 shows the relationship between the heat treatment time and the interface state density of the samples heat-treated in an atmosphere containing 0.8 percent by weight of water at 350° C. using a hot plate in Step 107. As is clear from FIG. 5, the samples heat-treated for 30 minutes or more have markedly low interface state density. FIG. 6 shows the relationship between the heat treatment time and the interface state density of the samples heat-treated in an atmosphere containing 0.8 percent by weight of water at 250° C., 350° C., or 450° C. using a hot plate or a furnace in Step 107. As is clear from FIG. 6, the samples heat-treated at 450° C. for three minutes or more or heat-treated at 350° C. for 30 minutes or more have markedly low interface state density. The interface state density of the samples heat-treated at 250° C. is not reduced without depending on the heat treatment time.

FIG. 7 shows the relationship between the water content of atmospheres and the interface state density of the samples heat-treated at 350° C. for 30 minutes using a hot plate in Step 107. As is clear from FIG. 7, the samples heat-treated in an atmosphere containing 0.4 percent by weight or more of water have markedly low interface state density. FIG. 8 shows the relationship between the hydrogen. content of atmospheres and the interface state density of the samples heat-treated at 350° C. for 30 minutes using a hot plate in Step 107. As is clear from FIG. 8, the samples heat-treated in an atmosphere containing 0.07 percent by weight or more of hydrogen have markedly low interface state density.

As is clear from the data described above, the samples heat-treated in Step 107 under the following conditions have markedly low interface state density: an atmosphere containing 0.07 percent by weight or more of hydrogen or 0.4 percent by weight or more of water, a heat treatment temperature of 350° C. or more, and a heat treatment time of three minutes or more. Furthermore, the samples heat-treated in Step 107 under the following conditions can be securely prevented from being deteriorated in quality: an atmosphere containing 0.2 percent by weight or less of hydrogen or 3.7 percent by weight or less of water, a heat treatment temperature of 700° C. or less, and a heat treatment time of 30 minutes or less. This is because oxide contained in the insulating layers of the samples is not reduced into oxygen by hydrogen; hence, no oxygen penetrates the superficial silicon layers of the samples and fine oxygen precipitates can therefore be prevented from being formed in the superficial silicon layers.

The method of this embodiment that uses the bonding process is as described below. With reference to FIGS. 9 and 10, this method includes an oxide layer-forming step (hereinafter referred to as Step 201) of forming oxide layers 21 on a silicon wafer 19 processed into a superficial silicon layer 5, a bonding step (hereinafter referred to as Step 203) of bonding a silicon support 7 having a mirror face one of the oxide layers 21 in such a manner that the mirror face is in contact with the oxide layer 21 functioning as an insulating layer 3, a polishing step (hereinafter referred to as Step 205) of polishing the top oxide layer 21 that is not in contact with the silicon support 7 to remove the top oxide layer 21 and further polishing the silicon wafer 19 to form the superficial silicon layer 5, and a hydrogen-introducing step (hereinafter referred to as Step 207) of annealing, or heat-treating the superficial silicon layer 5 in an atmosphere containing hydrogen or water, those steps being performed in that order.

In Step 201, the silicon wafer 19 is prepared and then heat-treated at, for example, 1,000° C. in a humid atmosphere, whereby the oxide layers 21 having a thickness of about 150 nm are each formed on both faces of the silicon wafer 19. In Step 203, one of the oxide layers 21 that is placed on lower face of the silicon wafer 19 is bonded to the mirror face of the silicon support 7 and these components are heat-treated at about 1,100° C., whereby the oxide layer 21 is securely bonded to the silicon support 7. The oxide layer 21 placed between the silicon wafer 19 and the silicon support 7 functions as the insulating layer 3. In Step 205, the top oxide layer 21 that is not in contact with the silicon support 7 is polished and thereby removed and the silicon wafer 19 is then polished and thereby reduced in thickness, whereby the silicon wafer 19 is converted into the superficial silicon layer 5 functioning as an active layer, that is, an SOI layer. According to this procedure, a SOI wafer 9 is obtained.

In Step 207 as well as Step 107, the SOI wafer 9 is heat-treated in such a manner that the SOI wafer 9 is placed on a hot plate placed in an atmosphere containing hydrogen or water or placed in a furnace in which the atmosphere contains hydrogen or water, whereby hydrogen is introduced into the SOI wafer 9. According to this procedure, the SOI wafer 9 is finished.

A procedure for investigating the relationship between the interface state density and the following factors will now be described: the hydrogen or water content of atmospheres used in Step 207 and the temperature and time of heat treatment performed in Step 207. SOI wafers having the same configuration as that of the SOI wafer 9 are prepared by processing boron-doped p-type wafers having a diameter of 200 mm in Steps 201 to 207 shown in FIG. 9. In particular, the SOI wafers are heat-treated in Step 207 under different conditions and native oxides are removed from the SOI wafers, which are cleaned with pure water and then dried. The SOI wafers are processed so as to have the MOSFET structure shown in FIG. 3, whereby samples for the investigation are obtained.

FIG. 11 shows the relationship between the heat treatment temperature and the interface state density of the samples heat-treated in an atmosphere containing 0.8 percent by weight of water at 350° C. using a hot plate in Step 207. As is clear from FIG. 11, the samples heat-treated for 30 minutes or more have markedly low interface state density. The samples prepared using the bonding process and treated in Step 207 under the same conditions as those of the samples prepared using the SIMOX process have interface state density similar to that of the samples prepared using the SIMOX process.

As described above, in the method of this embodiment, hydrogen is introduced in the interface between an insulating layer 3 and superficial silicon layer 5 of an SOI wafer 9 by treating the SOI wafer 9 in an atmosphere containing hydrogen or water. Therefore, the thickness of the superficial silicon layer 5 can be prevented from being reduced due to the formation of an oxynitride film. Furthermore, dangling bonds present at the interface between the insulating layer 3 and the superficial silicon layer 5 are terminated by the introduction of hydrogen; hence, the interface state density can be reduced. Since the introduction of hydrogen is not performed in a hydrogen atmosphere but an atmosphere containing hydrogen or water, oxide contained in the insulating layer 3 can be prevented from being reduced into oxygen; hence, no oxygen penetrates the superficial silicon layer 5. Therefore, the interface between the superficial silicon layer 5 and the insulating layer 3 can be reduced in interface state density without causing a deterioration in the quality of the SOI wafer 9.

Since the interface state density can be reduced as described above, electronic devices manufactured from the SOI wafer 9 have high carrier mobility; hence, such electronic devices can be operated at high speed with low power consumption. Thus, the electronic devices are superior in performance and reliability.

In known methods for manufacturing electronic devices using SOI wafers, the introduction of hydrogen usually leads to an increase in manufacturing cost. However, according to the method of this embodiment, since an SOI wafer 9 is subjected to hydrogen introduction, costs for manufacturing electronic devices can be reduced. Furthermore, the method of this embodiment is lower in manufacturing cost as compared to a method for forming nitrogen precipitates for reducing the interface state density, because a step of forming such nitrogen precipitates is not necessary nor a step of removing an oxynitride film.

In a hydrogen-introducing step, since an SOI wafer 9 is heat-treated at 305° C. for three minutes in an atmosphere containing 0.07 percent by weight or more of hydrogen or 0.4 percent by weight or more of water, the interface between the superficial silicon layer 5 and the insulating layer interface 3 can be reduced in interface state density without causing a deterioration in the quality of the SOI wafer 9.

Furthermore, if an SOI wafer 9 is heat-treated in such a manner that the SOI wafer 9 is placed on a hot plate, a manufacturing system can be simplified, because a furnace for heat treatment is not necessary.

In the method of this embodiment, since an oxide layer placed on a superficial silicon layer 5 of an SOI wafer 9 is removed therefrom before a hydrogen-introducing step is performed, hydrogen can be readily introduced into the interface between the superficial silicon layer 5 and an insulating layer 3. Therefore, the interface between the superficial silicon layer 5 and the insulating layer interface 3 can be reduced in interface state density without causing a deterioration in the quality of the SOI wafer 9.

Second Embodiment

Figure 12:
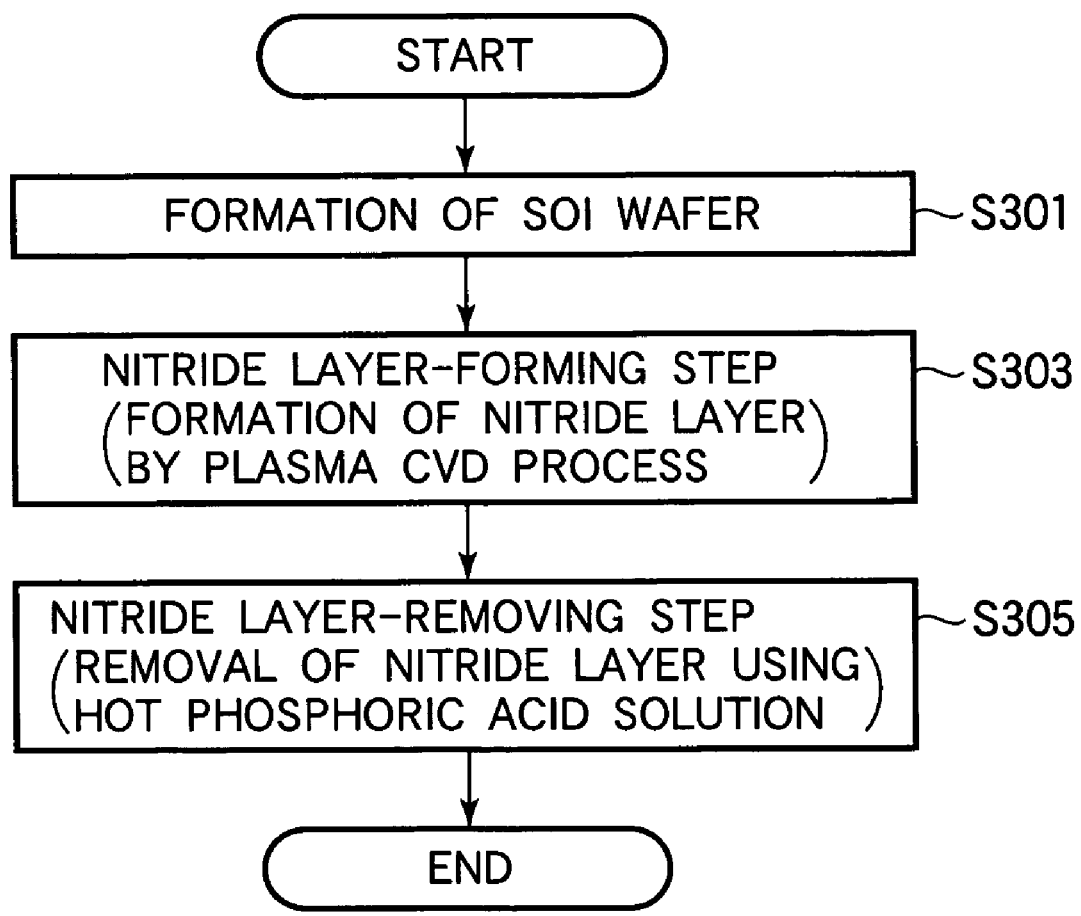
FIG. 12 is a flow chart illustrating a procedure for manufacturing an SOI wafer according to a second embodiment.
Figure 13:
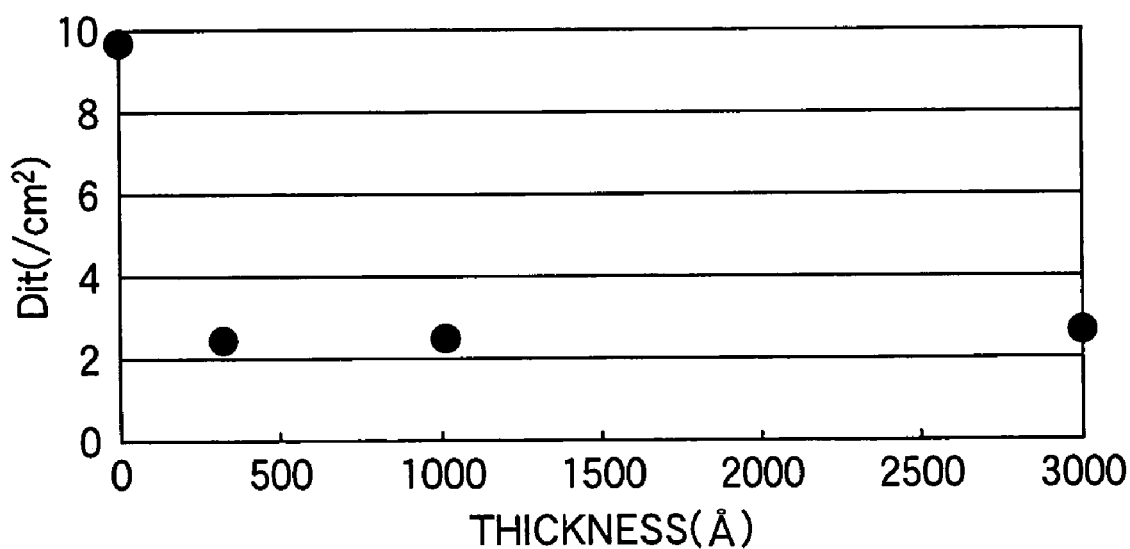
FIG. 13 is a graph showing the relationship between the thickness of nitride films and the interface state density of SOI wafers having the nitride films.

A method for manufacturing an SOI wafer according to a second embodiment of the present invention will now be described with reference to FIGS. 1 to 3, 9, 12 and 13. FIG. 12 is a flow chart illustrating a procedure for manufacturing an SOI wafer according to this embodiment. FIG. 13 is a graph showing the relationship between the thickness of nitride films and the interface state density of SOI wafers having the nitride films.

The method of this embodiment is different from that of the first embodiment in that heat treatment is not performed in an atmosphere containing hydrogen or water in a hydrogen-introducing step but hydrogen generated by forming a nitride film by a plasma-enhanced chemical vapor deposition (PECVD) process is used in the step. The PECVD process is one of processes for forming thin-films by vapor deposition. With reference to FIG. 12, the method of this embodiment includes a step (hereinafter referred to as Step 301) of preparing an SOI wafer 9, a step (hereinafter referred to as Step 303) of forming a nitride film by the PECVD process, and a step (hereinafter referred to as Step 305) of removing the nitride film. These steps are performed in that order. In Step 301, the SOI wafer 9 may be prepared according to Steps 101 to 103 shown in FIG. 1 or Steps 201 to 205 shown in FIG. 9.

The SOI wafer 9 obtained in Step 301 includes a silicon support 7, an insulating layer 3, and a superficial silicon layer 5 as shown in FIG. 2. Thermal or native oxides are disposed on the SOI wafer 9. In Step 303, the nitride film is formed on the superficial silicon layer 5 by the PECVD process in such a manner that the SOI wafer 9 is treated using a gas mixture containing about 20 percent by volume of a monosilane ($SiH_4$) gas, a ammonia ($NH_3$) gas, and a nitrogen gas under the following condition: a temperature of 350° C. to 450° C., a pressure of 46.6 Pa, and an RF power of 1.0 kW. The flow rate of the monosilane gas is 400 sccm, the flow rate of the ammonia gas is 30 sccm, and the flow rate of the nitrogen gas is 2 slm. Hydrogen is generated in this step and diffused in the interface between the superficial silicon layer 5 and the insulating layer 3, whereby the interface therebetween is reduced in interface state density.

In Step 305, since the nitride film is not necessary, the nitride film is removed using a hot phosphoric acid solution, whereby the SOI wafer 9 is finished.

A procedure for investigating the relationship between the interface state density and the nitride film thickness will now be described. SOI wafers having the same configuration as that of the SOI wafer 9 are prepared by processing boron-doped p-type wafers having a diameter of 200 mm in Steps 301 to 305 shown in FIG. 12. In particular, the introduction of hydrogen is performed by depositing nitride films having different thicknesses on the SOI wafers, the nitride films are removed therefrom, native oxides are then removed from the SOI wafers using hydrofluoric acid, and the SOI wafers are cleaned with pure water and then dried. The resulting SOI wafers are processed so as to have the MOSFET structure shown in FIG. 3, whereby samples are obtained. The samples are investigated in the same manner as described in the first embodiment.

FIG. 13 shows the relationship between the thickness of the deposited nitride films and the interface state density. As is clear from FIG. 13, the samples having the nitride film with a thickness of 300 Å or more have markedly low interface state density.

According to the method of this embodiment, hydrogen is generated by forming the nitride film by the PECVD process and introduced in the interface between the insulating layer 3 and the superficial silicon layer 5 but no nitrogen precipitates are formed nor oxide contained in the insulating layer 3 are reduced into oxygen; hence, no oxygen penetrates the superficial silicon layer 5. Dangling bonds present at the interface therebetween the superficial silicon layer 5 and the insulating layer 3 are terminated by the introduction of hydrogen; hence, the interface therebetween is allowed to have low interface state density. That is, the interface therebetween can be reduced in interface state density without causing a deterioration in the quality of the SOI wafer 9.

Furthermore, the interface therebetween can be readily reduced in interface state density by allowing the nitride film formed in Step 303 to have a thickness of 300 Å or more.

Third Embodiment

Figure 14:
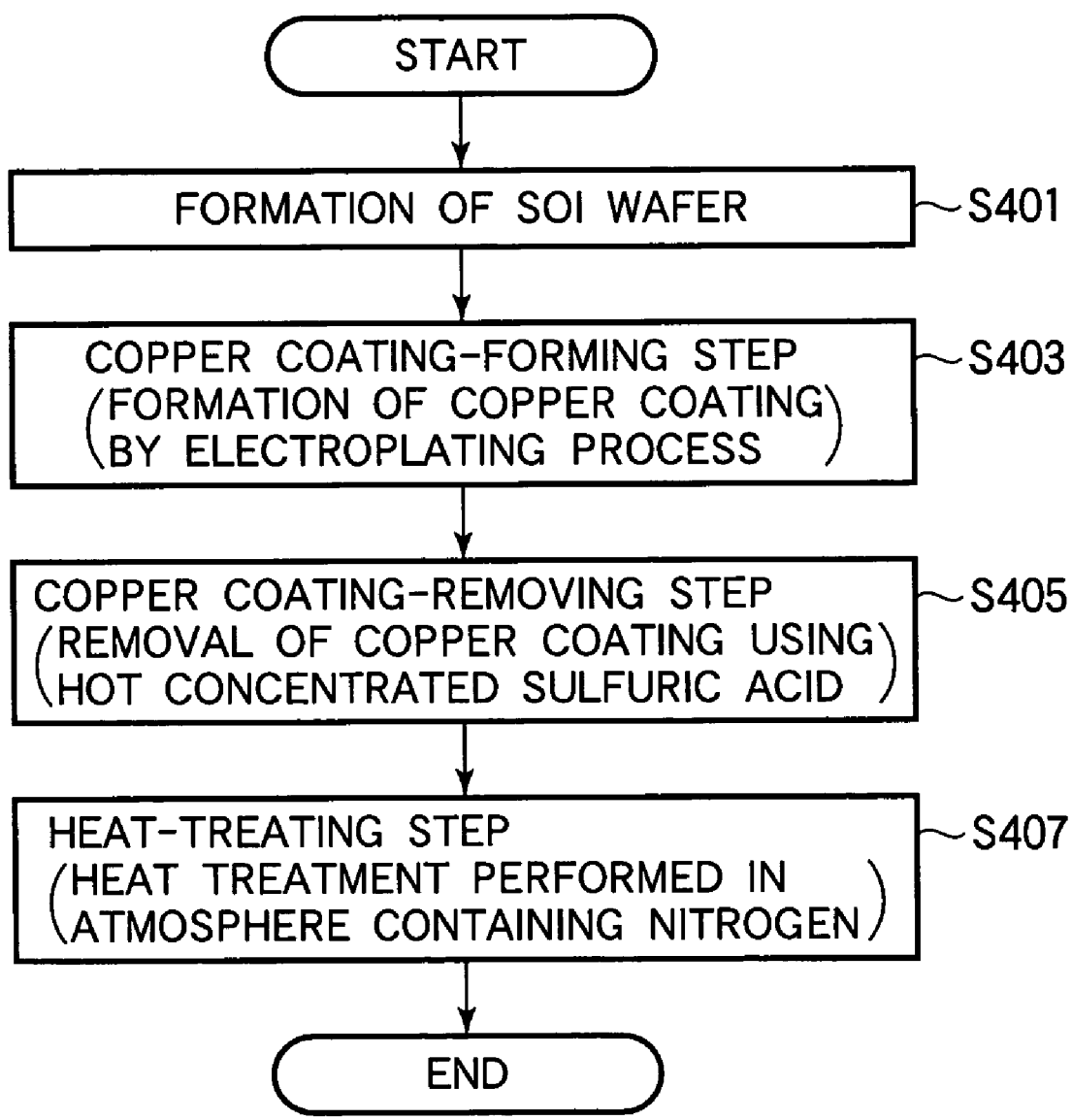
FIG. 14 is a flow chart illustrating a procedure for manufacturing an SOI wafer according to a third embodiment.
Figure 15:
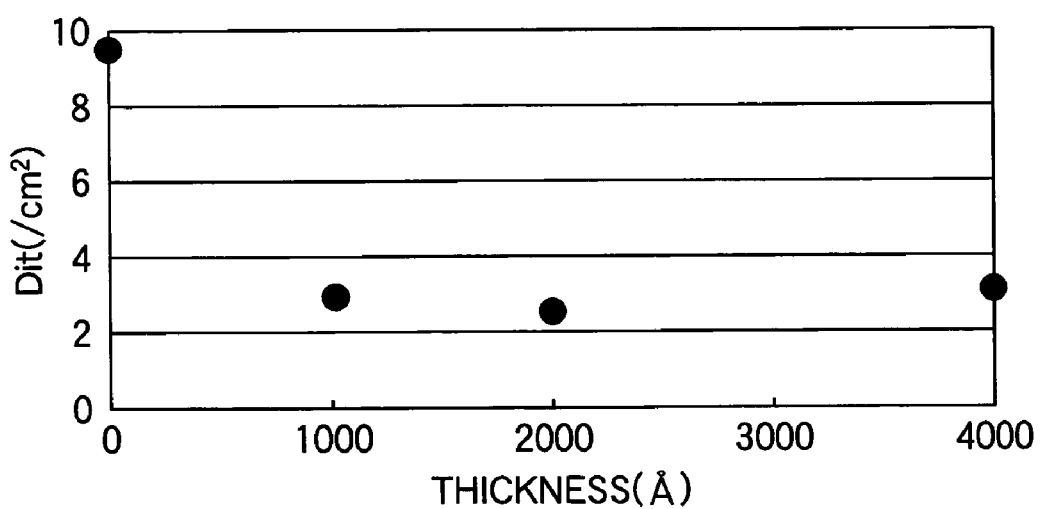
FIG. 15 is a graph showing the relationship between the thickness of copper films and the interface state density of SOI wafers having the copper films.

A method for manufacturing an SOI wafer according to a third embodiment of the present invention will now be described with reference to FIGS. 1 to 3, 9, 14 and 15. FIG. 14 is a flow chart illustrating a procedure for manufacturing an SOI wafer according to this embodiment. FIG. 15 is a graph showing the relationship between the thickness of copper films and the interface state density of SOI wafers having the copper films.

The method of this embodiment is different from that of the first embodiment in that heat treatment for the introduction of hydrogen is not performed in an atmosphere containing hydrogen or water. The method of this embodiment is different from that of the second embodiment in that a copper film is formed by an electroless plating process. With reference to FIG. 14, the method of this embodiment includes a step (hereinafter referred to as Step 401) of preparing an SOI wafer 9, a step (hereinafter referred to as Step 403) of forming a copper film is formed on the SOI wafer 9 by an electroless plating process, a step (hereinafter referred to as Step 405) of removing the copper film from the SOI wafer 9, and a step (hereinafter referred to as Step 407) of heat-treating the resulting SOI wafer 9. These steps are performed in that order. In Step 401, the SOI wafer 9 may be prepared according to Steps 101 to 103 shown in FIG. 1 or Steps 201 to 205 shown in FIG. 9.

The SOI wafer 9 obtained in Step 401 includes a silicon support 7, an insulating layer 3, and a superficial silicon layer 5 as shown in FIG. 2. Thermal or native oxides are disposed on the SOI wafer 9. In Step 403, Ti/TiN barrier metals are deposited on the thermal or native oxides by a sputtering process, whereby a metal layer with a thickness of about 50 nm is formed over the thermal or native oxides. A seed layer, made of copper, having a thickness of about 50 nm is formed on the metal layer. A copper film is deposited on the seed layer by an electroless plating process using a sulfate plating solution containing 0.04 mol/L of copper sulfate ($CuSO_4.5H_2O$), 0.1 mol/L of Rochelle salt ($KNaC_4H_4O_6.4H_2O$) that is a kind of tartrate, and 0.1 mol/L of formic aldehyde functioning as a reductant. Hydrogen is generated in this step and diffused in the interface between the superficial silicon layer 5 and the insulating layer 3, whereby the interface therebetween is reduced in interface state density.

In Step 405, since the copper film, the seed layer, and the barrier metals are not necessary, they are removed from the SOI wafer 9 using hot concentrated sulfuric acid. In Step 407, the resulting SOI wafer 9 is heat-treated at a temperature of 350° C. to 450° C. for about 30 minutes, whereby the SOI wafer 9 is finished.

A procedure for investigating the relationship between the interface state density and the copper film thickness will now be described. SOI wafers having the same configuration as that of the SOI wafer 9 are prepared by processing boron-doped p-type wafers having a diameter of 200 mm in Steps 401 to 407 shown in FIG. 14. In particular, the introduction of hydrogen is performed by depositing copper films having different thicknesses on the SOI wafers, the copper film are removed therefrom, native oxides are then removed from the SOI wafers using hydrofluoric acid, and the SOI wafers are cleaned with pure water and then dried. The resulting SOI wafers are processed so as to have the MOSFET structure shown in FIG. 3, whereby samples are obtained. The samples are investigated in the same manner as described in the first embodiment.

FIG. 15 shows the relationship between the thickness of the deposited copper films and the interface state density. As is clear from FIG. 15, the samples having the copper films with a thickness of 100 Å or more have markedly low interface state density.

According to the method of this embodiment, hydrogen is generated by forming the copper films by the electroless plating and introduced in the interface between the insulating layer 3 and the superficial silicon layer 5 but no nitrogen precipitates are formed nor oxide contained in the insulating layer 3 are reduced into oxygen; hence, no oxygen penetrates the superficial silicon layer 5. Dangling bonds present at the interface therebetween the superficial silicon layer 5 and the insulating layer 3 are terminated by the introduction of hydrogen; hence, the interface between the superficial silicon layer 5 and the insulating layer interface 3 is allowed to have low interface state density. That is, the interface therebetween can be reduced in interface state density without causing a deterioration in the quality of the SOI wafer 9.

Furthermore, the interface therebetween can be readily reduced in interface state density by allowing the nitride film formed in Step 403 to have a thickness of 1,000 Å or more.

The present invention is not limited to the methods described in the first to third embodiments. A method according to the present invention includes a step of heat-treated in an atmosphere containing hydrogen or water and a step of forming a layer using a reaction to generate hydrogen and a step of removing the layer and may further include various steps.

What is claimed is:

1. A method for manufacturing a SOI wafer, comprising:
   a step of forming a SOI wafer including a silicon support, an insulating layer containing oxide, and a superficial silicon layer arranged in that order; and
   a step of introducing hydrogen into the interface between the insulating layer and the superficial silicon layer, these steps being performed in that order,
   wherein the SOI wafer is heat-treated at 750° C. or less for 30 minutes or less in an atmosphere containing 0.2 percent by weight or less of hydrogen or 3.7 percent by weight or less of water in the hydrogen-introducing step.

2. The method according to claim 1, wherein the SOI wafer is heat-treated at 350° C. or more for three minutes or more in an atmosphere containing 0.07 percent by weight or more of hydrogen or 0.4 percent by weight or more of water in the hydrogen-introducing step.

3. The method according to claim 2, wherein the SOI wafer is placed on a hot plate in the hydrogen-introducing step.

4. The method according to claim 2, further comprising a step of removing an oxide layer present on the superficial silicon layer, the oxide layer-removing step being performed prior to the hydrogen-introducing step.

5. The method according to claim 1, wherein the SOI wafer is placed on a hot plate in the hydrogen-introducing step.

6. The method according to claim 5, further comprising a step of removing an oxide layer present on the superficial silicon layer, the oxide layer-removing step being performed prior to the hydrogen-introducing step.

7. The method according to claim 1, further comprising a step of removing an oxide layer present on the superficial silicon layer, the oxide layer-removing step being performed prior to the hydrogen-introducing step.

8. A method for manufacturing a SOI wafer, comprising:
   a step of forming a SOI wafer including a silicon support, an insulating layer containing oxide, and a superficial silicon layer arranged in that order;
   a step of introducing hydrogen into the interface between the insulating layer and the superficial silicon layer by forming a film on an oxide layer present on the SOI wafer using a reaction to generate hydrogen, wherein the film contains nitride and is formed by a plasma-enhanced chemical vapor deposition process using a monosilane gas and an ammonia gas; and
   a step of removing the film, these steps being performed in that order.

9. The method according to claim 8, wherein the film containing nitride has a thickness of 300 Å or more.

10. A method for manufacturing a SOI wafer, comprising:
    a step of forming a SOI wafer including a silicon support, an insulating layer containing oxide, and a superficial silicon layer arranged in that order;
    a step of introducing hydrogen into the interface between the insulating layer and the superficial silicon layer, these steps being performed in that order, wherein the SOI wafer is heat-treated in an atmosphere containing hydrogen or water in the hydrogen-introducing step; and
    a step of removing an oxide layer present on the superficial silicon layer, the oxide layer-removing step being performed prior to the hydrogen-introducing step.

11. A method for manufacturing a SOI wafer, comprising:
    a step of forming a SOI wafer including a silicon support, an insulating layer containing oxide, and a superficial silicon layer arranged in that order;
    a step of introducing hydrogen into the interface between the insulating layer and the superficial silicon layer by forming a film on an oxide layer present on the SOI wafer using a reaction to generate hydrogen, wherein the film contains copper and is formed by an electroless plating process using a copper sulfate solution; and
    a step of removing the film, these steps being performed in that order.

12. The method according to claim 11, wherein the film containing copper has a thickness of 1,000 Å or more.

* * * * *